US012769346B2

(12) United States Patent
Strom et al.

(10) Patent No.: US 12,769,346 B2
(45) Date of Patent: Oct. 20, 2026

(54) INTEGRATED CIRCUIT ON CHIP REGULATOR OUTPUT POWER-GROUND SHORTS DETECTOR

(71) Applicant: International Business Machines Corporation, Armonk, NY (US)

(72) Inventors: James Strom, Rochester, MN (US); Grant P. Kesselring, Rochester, MN (US); John Borkenhagen, Rochester, MN (US); Joshua M. Chica, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 258 days.

(21) Appl. No.: 18/744,193

(22) Filed: Jun. 14, 2024

(65) Prior Publication Data

US 2025/0383677 A1 Dec. 18, 2025

(51) Int. Cl.
*G01R 31/3187* (2006.01)
*G05F 1/565* (2006.01)
(Continued)

(52) U.S. Cl.
CPC ................ *G05F 1/565* (2013.01); *G05F 1/59* (2013.01); *G05F 3/262* (2013.01); *H03K 17/0822* (2013.01); *H03K 17/223* (2013.01)

(58) Field of Classification Search
CPC ............ G05F 1/59; G05F 1/565; G05F 3/262; H03K 17/0822; H03K 17/223
See application file for complete search history.

(56) References Cited

U.S. PATENT DOCUMENTS 7,835,220 B2 11/2010 Ishikawa
9,496,880 B1 11/2016 Yin et al.
(Continued)

FOREIGN PATENT DOCUMENTS

CN 106484017 A 3/2017
CN 112882525 A 6/2021
(Continued)

OTHER PUBLICATIONS

Martin et al., Use of Resistive Voltage Dividers for Transformer Tertiary Ground Detection, 75th Annual Conference for Protective Relay Engineers, 2022.
(Continued)

*Primary Examiner* — Thang X Le
(74) *Attorney, Agent, or Firm* — Kristofer Haggerty, Esq.; Kevin P. Radigan, Esq.; Heslin Rothenberg Farley & Mesiti P.C.

(57) ABSTRACT

Embodiments of the present disclosure provide enhanced systems and methods for detecting output power-ground shorts in on-chip voltage regulators, such as used for phase-locked loop (PLL) circuits in integrated circuit (IC) chips. A disclosed regulator output power-ground short detector can detect both initial output power-ground shorts of the on-chip voltage regulator including initial high resistance output power-ground shorts, and output power-ground shorts that can occur in a user's environment and degrade over time for example, resulting from a degrading or failing output voltage regulator analog (VRA) capacitor. In an embodiment, the regulator output power-ground short detector detects predefined threshold voltage offsets of a degraded power-ground short over time, and transmits warning notifications that enable corrective actions, such as repair or replacement before failure of the PLL circuits.

20 Claims, 7 Drawing Sheets

(51) Int. Cl.

| | |
|---|---|
| ***G05F 1/59*** | (2006.01) |
| ***G05F 3/26*** | (2006.01) |
| ***H03K 17/082*** | (2006.01) |
| ***H03K 17/22*** | (2006.01) |

(56) References Cited

U.S. PATENT DOCUMENTS

| | | | | |
|---|---|---|---|---|
| 10,374,413 | B2 | 8/2019 | Watanabe | |
| 10,761,549 | B2 | 9/2020 | Sasmal et al. | |
| 10,840,696 | B2 | 11/2020 | Pearce et al. | |
| 11,057,976 | B2 | 7/2021 | Jiang et al. | |
| 11,177,647 | B2 | 11/2021 | Katsukura et al. | |
| 11,177,734 | B2 | 11/2021 | Borfigat et al. | |
| 11,217,992 | B2 | 1/2022 | Wong et al. | |
| 11,782,087 | B2 * | 10/2023 | Takano | G01R 31/2884 324/750.3 |
| 2012/0092800 | A1 | 4/2012 | Ko | |
| 2012/0146692 | A1 | 6/2012 | Yun | |
| 2017/0063232 | A1 * | 3/2017 | Takano | G05F 1/56 |
| 2017/0077933 | A1 | 3/2017 | Zhang et al. | |
| 2019/0199207 | A1 | 6/2019 | Hsueh et al. | |
| 2021/0143740 | A1 * | 5/2021 | Oddicini | H02M 3/33507 |
| 2021/0203329 | A1 | 7/2021 | Finocchiaro et al. | |
| 2021/0344189 | A1 * | 11/2021 | Colarossi | H02H 7/20 |
| 2022/0014013 | A1 | 1/2022 | Zhong | |
| 2022/0197321 | A1 | 6/2022 | Tiagaraj et al. | |
| 2023/0130733 | A1 | 4/2023 | Zhang | |
| 2023/0228802 | A1 | 7/2023 | Halalchi | |
| 2023/0299438 | A1 * | 9/2023 | Mocanu | H01M 50/578 |
| 2023/0327540 | A1 | 10/2023 | Warnes | |
| 2025/0110176 | A1 * | 4/2025 | Jing | G01R 31/31922 |

FOREIGN PATENT DOCUMENTS

| | | | |
|---|---|---|---|
| CN | 113422352 | A | 9/2021 |
| CN | 217561690 | U | 10/2022 |
| CN | 218771417 | U | 3/2023 |
| CN | 116014674 | A | 4/2023 |
| CN | 218867909 | U | 4/2023 |
| CN | 218888113 | U | 4/2023 |
| CN | 218920272 | U | 4/2023 |

OTHER PUBLICATIONS

Park et al., High Efficiency Fully Integrated On-Chip Regulator for Wide-Range Output Current, Oct. 2020, DOI: 10.1109/ISCAS45731.2020.9180776.

Turner et al., Ground-Referenced Signaling for Intra-Chip and Short-Reach Chip-to-Chip Interconnects, IEEE, 2018.

Lee et al., Ground Fault Detection Using Hybrid Method in IT System LVDC Microgrid, Energies 2020, 13, 2606; doi:10.3390/en13102606.

Roy et al., An Ultra-Fast and Non-Invasive Short Circuit Protection Strategy for a WBG Power Electronics Converter with Multiple Half-Bridge Legs, IEEE, 2020, pp. 2505-2510.

Heydari et al., Analysis of the PLL Jitter Due to Power/Ground and Substrate Noise, IEEE Transactions On Circuits and Systems-I: Regular Papers, 2004.

* cited by examiner

INTEGRATED CIRCUIT ON CHIP REGULATOR OUTPUT POWER-GROUND SHORTS DETECTOR

BACKGROUND

The present invention relates to the field of integrated circuits (ICs), and more specifically, to methods and systems for detecting output power-ground shorts in on-chip voltage regulators used in integrated circuit (IC) or IC chip designs.

High performance integrated circuits, such as microprocessors and memory systems, typically include many phase-locked loop (PLL) circuits and integrated IC on-chip voltage regulators. PLL circuits in IC or IC chip designs are used for various different applications, such as high-speed data communications and clock generation in complex electronic systems, such as computer and memory systems. PLL circuits are used in environments of high switching noise, for example in microprocessor IC chips with static random access memory (SRAM), and many logic circuits that cause significant switching noise. Typically, PLL circuits include complex analog and digital custom circuitry, such as voltage controlled oscillator (VCO) circuits, charge pump circuits, voltage references, voltage dividers and clock buffers, and require a quiet (e.g., low noise) power supply. An on-chip voltage regulator is arranged for minimizing noise and voltage fluctuations of its output voltage or voltage regulator analog (VRA), for example to provide a quiet output voltage for the PLL circuits. The PLL circuits are sensitive to micro-Volts (μV) of noise on the output voltage, which can cause jitter on the PLL output clock. A power supply output VRA capacitor is often required for on-chip voltage regulators to work effectively. Since IC designs and systems have moved to smaller IC technologies; for example, five (5) nm and lower IC technologies, deep trench capacitors are no longer available. Typically, a combination of diffusion capacitance and metal capacitance are used to implement a power supply output VRA capacitor. Current power supply output VRA capacitors are susceptible to metals shorting together, which can result in output power-ground shorts (i.e., shorts from the regulator output to ground). New techniques are needed for detecting output power-ground shorts in on-chip voltage regulators, for example, that can enable efficient and effective regulator performance and reliability.

SUMMARY

Embodiments of the present disclosure are directed to enhanced systems and methods for detecting output power-ground shorts in on-chip voltage regulators in integrated circuit (IC) chips.

A non-limiting method of one disclosed embodiment includes comparing, by a comparator, an output voltage of an on-chip voltage regulator, and a predefined voltage reference to detect a threshold voltage offset, wherein the threshold voltage offset represents an output power-ground short; and transmitting, by an error and control logic, a warning notification based on the threshold voltage offset.

An aspect of a non-limiting method of one disclosed embodiment includes forming a voltage divider by a plurality of series-connected resistors connected between a voltage reference received by the on-chip voltage regulator and a ground potential, to provide a respective predefined voltage reference at respective taps between the series-connected resistors; comparing, by a set of comparators, the respective predefined voltage references and an output voltage of an on-chip voltage regulator, to detect respective threshold voltage offsets, wherein the respective threshold voltage offsets represents a respective output power-ground short.

An aspect of a non-limiting method of one disclosed embodiment includes establishing a chip test mode for the on-chip voltage regulator to limit an output current for the on-chip voltage regulator; comparing, by a comparator, the output voltage and a predefined reference voltage, to detect a threshold voltage offset, wherein the threshold voltage offset represents an output power-ground short; and transmitting, by an error and control logic, a warning notification based on the threshold voltage offset.

A non-limiting system of one disclosed embodiment includes an on-chip voltage regulator configured to receive a reference voltage and provide an output voltage in an integrated circuit (IC); a comparator configured to compare the output voltage with a predefined reference voltage, to detect a threshold voltage offset, wherein the threshold voltage offset represents an output power-ground short; and an error and control logic configured to transmit a warning notification based on the threshold voltage offset.

DETAILED DESCRIPTION

Figure 1:
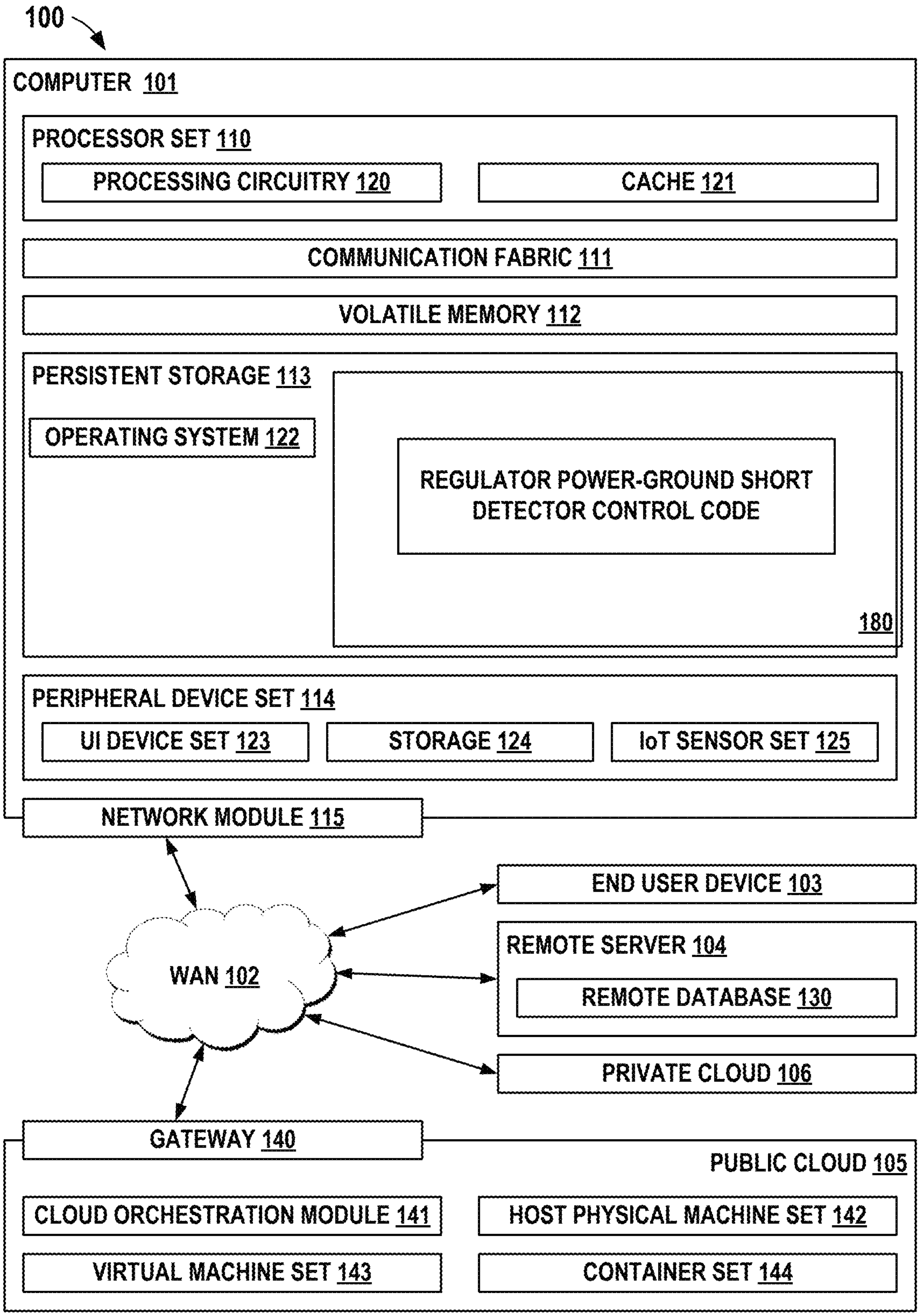
FIG. 1 is a block diagram of an example computer environment for use in conjunction with one or more embodiments of the present disclosure.

Embodiments herein describe techniques for detecting output power-ground shorts in IC on-chip voltage regulators, using hardware components and computer software tools. A disclosed output power-ground short detector detects both initial output power-ground shorts of the on-chip voltage regulator including initial high resistance output power-ground shorts and output power-ground shorts that can occur in a user's environment and degrade over time for example, resulting from a degrading or failing output VRA capacitor.

In an embodiment, the regulator output power-ground short detector includes a voltage divider providing a plurality of voltage references, a plurality of comparators, coupled to the voltage divider, to compare the plurality of voltage references to an output voltage of an on-chip voltage regulator, to the detect predefined threshold voltage offsets; and an error and control logic to report warning notifications to a service processor when the output voltage droops by respective threshold voltage offsets at the plurality of voltage references. In an embodiment, the error and control logic produces warning notifications at the set threshold voltage offsets before the output voltage decreases below a minimum output voltage, for example, below a required output voltage to support associated PLL circuits. The warning notifications can enable corrective actions, such as repair or replacement of a field replacement unit or processor chip before failure of the on-chip voltage regulator.

In an embodiment, the regulator output power-ground short detector performs a chip test mode for the on-chip voltage regulator, limiting an output current supplied by the on-chip voltage regulator. In an embodiment, the on-chip voltage regulator includes a plurality of output current tiles supplying the output current, and current limiting circuitry to limit the output current supplied during an initial chip test mode. In one embodiment, the on-chip voltage regulator includes current limiting circuitry that selectively enables at least one output current tiles to supply output current for the initial chip test mode. In one embodiment, the on-chip voltage regulator includes current limiting circuitry that provides a current control input to the plurality of output current tiles to limit the output current supplied by the plurality of output current tiles for the initial chip test mode.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to “the invention” shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment (“CPP embodiment” or “CPP”) is a term used in the present disclosure to describe any set of one, or more, storage media (also called “mediums”) collectively included in a set of one, or more, storage devices that collectively include machine readable code corresponding to instructions and/or data for performing computer operations specified in a given CPP claim. A “storage device” is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as a Regulator Power-Ground Short Detector Control Code 182, at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IOT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Figure 2:
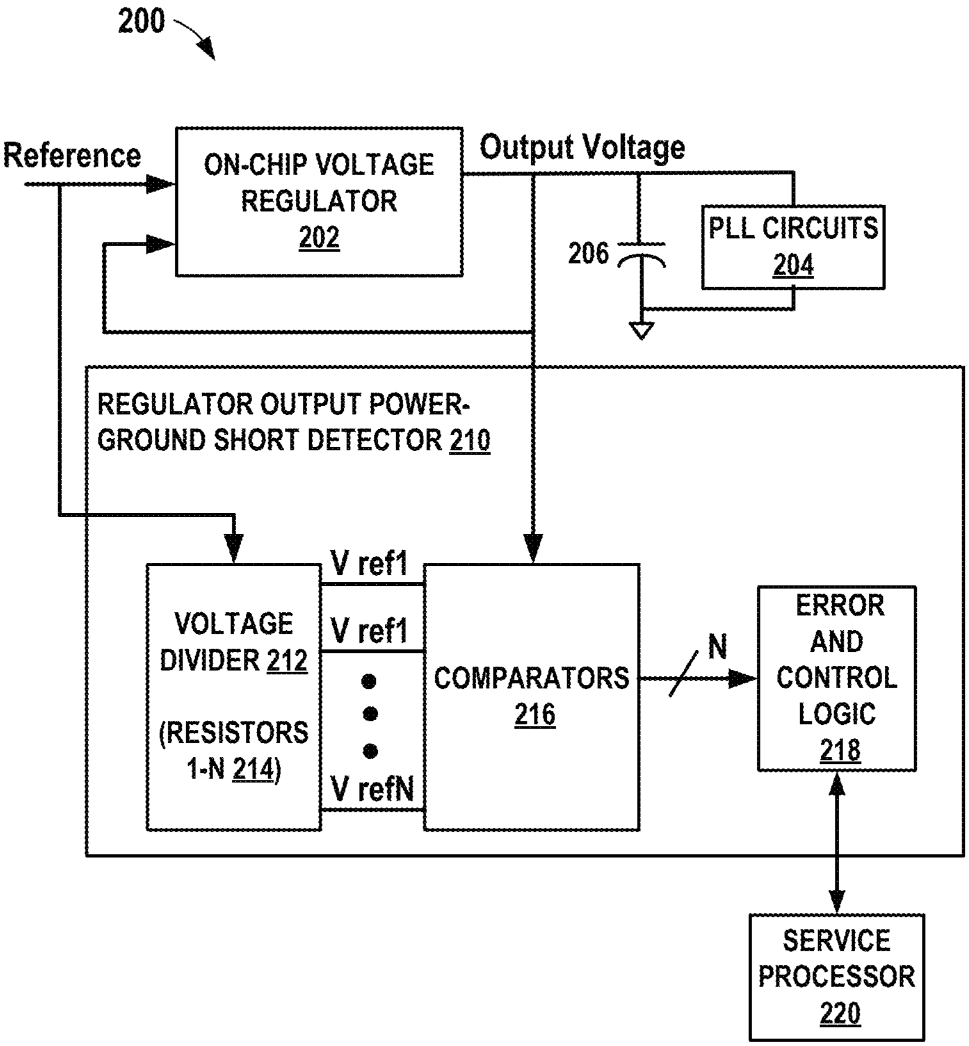
FIG. 2 is a block diagram of an example system for detecting output power-ground shorts in on-chip voltage regulators of one or more embodiments of the present disclosure.

FIG. 2 illustrates an example system 200 for detecting output power-ground shorts in an on-chip voltage regulator 202 of disclosed embodiments. System 200 can be used in conjunction with the computer 101 and cloud environment of the computing environment 100 of FIG. 1 with the Regulator Power-Ground Short Detector Control Code 182 for implementing methods according to one or more embodiments.

System 200 enables detecting both initial output power-ground shorts of the on-chip voltage regulator 202 and output power-ground shorts that occur over time, such as resulting from degradation of a failing output VRA capacitor. System 200 enables providing reliability, availability, and serviceability (RAS) for chip designs including the on-chip voltage regulator 202 of disclosed embodiments.

In system 200, the on-chip voltage regulator 202 advantageously is used for various applications. In particular, the on-chip voltage regulator 202 provides effective and reliable output voltage that is applied to one or more Phase-locked loop (PLL) circuits 204, for example, the output voltage indicated by line Output Voltage. The on-chip voltage regulator 202 includes a suitable implementation arranged for minimizing noise and voltage fluctuations of its output voltage applied to a feedback input of the on-chip voltage regulator 202 and a regulator output power-ground short detector 210.

As shown, the on-chip voltage regulator 202 receives a reference voltage indicated at line Reference at a first input, and the output voltage at the feedback input. In an embodiment, the reference voltage Reference is received from an external power supply or other power supply. The on-chip voltage regulator 202 includes a power supply output VRA capacitor 206 connected between the regulator output voltage and ground (GND) to provide a quiet output voltage. The output VRA capacitor 206 can enable an effective output voltage with minimized noise for the PLL circuits 204. The output VRA capacitor 206 mitigates or compensates for noise on the output voltage received by the PLL circuits 204. For example, the PLL circuits 204 are sensitive to micro-Volts (μV) of noise on the output voltage, that otherwise could cause jitter on the PLL output clock.

In an embodiment, a Metal-Insulator-Metal (MIM) capacitor 206 implements the output VRA capacitor 206 in an available IC area, to provide, for example, a capacitance value in a range between 500 pF and 800 pF for the output VRA capacitor 206 on the regulator output between the output VRA rail and ground potential. In current high performance silicon (Si) technologies such as 7 nm, 5 nm, 3 nm and the like, deep trench capacitors are not available. The MIM capacitor 206 is susceptible to shorting between its metal layers, where output power-ground shorts can result from the output VRA capacitor 206 (i.e., shorts from the regulator output to ground).

System 200 includes the regulator output power-ground short detector 210 arranged in accordance with disclosed embodiments. The regulator output power-ground short detector 210 detects both initial output power-ground shorts of the on-chip voltage regulator 202 including initial high resistance output power-ground shorts, and output power-ground shorts that occur in a user's environment, for example, resulting from a degrading or failing output VRA capacitor 206 over time. The output power-ground shorts may be progressive over time for example, starting as a high resistance short that the on-chip voltage regulator 202 can support and maintain a target voltage level of the output voltage, and decreasing over time. The output power-ground shorts can degrade over time providing progressively lower resistance values until the on-chip voltage regulator 202 cannot support an adequate output voltage for the PLL circuits 204 to operate.

For example, in an embodiment, where the on-chip voltage regulator 202 can support a maximum current of 215 mA, with an output power-ground short resistance value of 3 Ω(Ohms), the on-chip voltage regulator 202 can drive the output voltage to about 600 mV (e.g., the on-chip voltage regulator 202 cannot provide a minimum output voltage of 700 mV required for functional operations of PLL circuits 204). For example, the output voltage of 600 mV is too low for the PLL circuits 204 to maintain lock and can cause the PLL circuits 204 and the IC chip to fail. In accordance with disclosed embodiments, the regulator output power-ground short detector 210 can detect degrading voltage outputs of the voltage regulator 202 and transmit warning notifications to enable a corrective action, such as repair or replacement before failure results.

In accordance with disclosed embodiments, the regulator output power-ground short detector 210 includes a voltage divider 212 providing a plurality of voltage references, a plurality of comparators 216 coupled to the voltage divider 212 to compare the plurality of voltage references to the output voltage to detect predefined threshold voltage offsets, and an error and control logic 218 to report warning notifications to a service processor 220 when the output voltage droops by respective threshold voltage offsets of the plurality of voltage references. For example, providing warning notifications based on the detected threshold voltage offsets enable corrective actions before failure of the PLL circuits 204 and failure of processors in the IC chip. In an disclosed embodiment, the warning notifications produced by the regulator output power-ground short detector 210 are sent to a service processor 220 to enable timely corrective actions before failure of the PLL circuits 204.

As shown, the voltage divider 212 includes a plurality of resistors 1-N 214, and receives the reference voltage Reference applied to an input of the on-chip voltage regulator 202, providing a plurality of voltage references V ref1 through V refN. In an embodiment, the error and control logic 218 can report multiple warning notifications to the service processor 220 to enable repair or replacement of the processor chip before the PLL circuits 204 would otherwise fail. In an embodiment, the error and control logic 218 provides current limiting control signals to the on-chip voltage regulator 202, and a reset mode control to the PLL circuits 204 for an initial chip test mode by the regulator output power-ground short detector 210.

Figure 3:
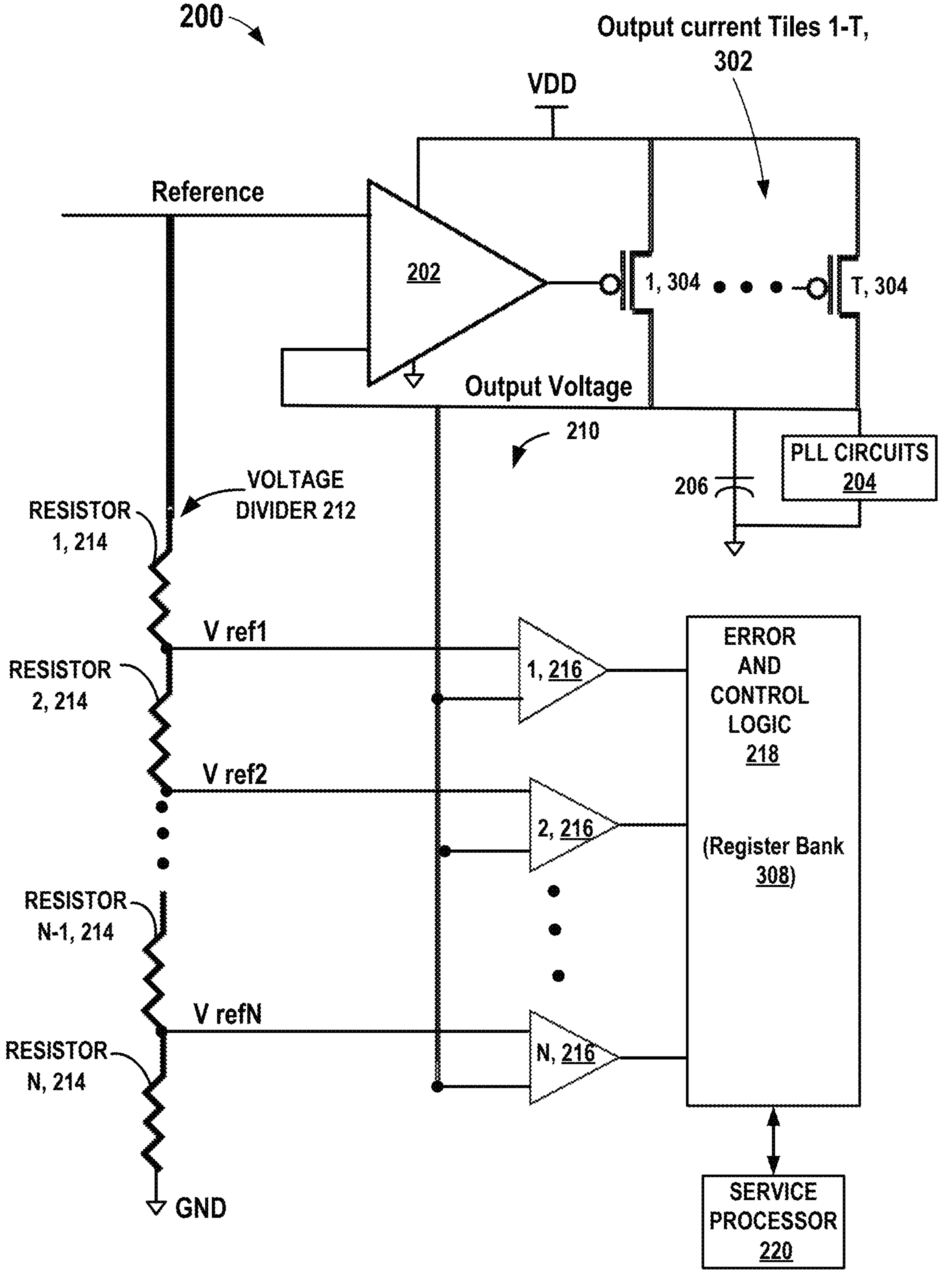
FIG. 3 is a schematic and block diagram illustrating further example details of an on-chip voltage regulator and a regulator output power-ground short detector of the system of FIG. 2 of disclosed embodiments.

Referring also to FIG. 3, an example on-chip voltage regulator 202 includes a plurality of output current tiles 1-T, 302. As shown, each of output current tiles 1-T, 302 includes a respective output transistor 1-T, 304 providing output current to regulate the output voltage of the on-chip voltage regulator 202. As shown, the output transistor 304 is implemented by a p-type field effect transistor (PFET) (e.g., the output transistor 304 of the output current tiles 1-T, 302 may be implemented with various transistor types, such as a metal-oxide semiconductor field effect transistors (MOSFET), p-channel PFETs, or n-channel NFETs). As shown, the PFET 304 has a reference voltage VDD coupled to its source and its drain provides the output current for a normal functional mode. The output transistor 304 alternatively can be implemented by an n-type field effect transistor (NFET). In an embodiment, the reference voltage VDD may be the same reference voltage Reference that is received from an external power supply or an on-chip reference voltage.

In FIGS. 3, 4A, 4B, 5, and 6, the same reference numbers are used for identical or similar components as used in FIG. 2. FIG. 3 illustrates an example resistor divider (RDIV) that implements the voltage divider 212 including the resistors 1-N, 214. The resistor divider 212 includes the plurality of resistors 1-N, 214 connected in series between the reference voltage and ground (GND). The resistor divider 212 provides a plurality of voltage references V ref1 through V refN at respective taps between the series-connected resistors 1-N, 214. The reference voltage applied to the on-chip voltage regulator 202 is divided into "N" steps, or threshold voltage offsets, to provide the plurality of voltage references V ref1 through V refN at respective taps between the series-connected resistors 1-N, 214 of the resistor divider 212. A variable number of N increments can be selected based on the capability of the on-chip voltage regulator 202 and the power or current requirements of the PLL circuits 204. For example, with a 1.0 V reference voltage Reference, 100 resistors 214 can provide 10 mV increments or 10 resistors 214 can provide 100 mV increments, or various other combinations can be selected.

As shown in FIG. 3, a series of the comparators 1-N, 216 compare the output voltage of the on-chip voltage regulator 202, and a respective voltage reference of V ref1 through V refN of a respective resistor divider tap. The series of the comparators 1-N, 216 detect a respective threshold voltage offset by the comparators, where the respective threshold voltage offset represents a respective output power-ground short. The comparators 216 can detect a respective voltage droop or threshold voltage offset corresponding to respective voltage references V ref1 through V refN. As shown, the error and control logic 218 includes a register bank 308 coupled to the comparators 1-T, 216, which receives respective detected threshold voltage offsets from the comparators 216, used by the error and control logic 218 to transmit respective associated warning notifications to the service processor 220.

In an embodiment, the respective threshold voltage offsets detected by the comparators 216 represent progressive output power-ground shorts that degrade over time, for example, resulting from metal shorting of the output VRA capacitor 206, which sequentially provide a lower resistance value for failing capacitor output power-ground shorts over time. In an illustrative example, a normal output voltage of the on-chip voltage regulator 202 is 1.0 V (Volt), (e.g., the respective predefined voltage references include Vref1 of 0.9 V, Vref2 of 0.8 V, and Vref3 of 0.7 V), for example a failure results with a threshold voltage offset greater than 0.3 V. In this example, the output of the first comparator 1, 216 will flip to zero with a voltage droop or a threshold voltage offset of 0.1 V from the normal output voltage, and the error and control logic 218 sends a warning notification to the service processor 220 based on the threshold voltage offset of 0.1 V detected by the output flip of the first comparator 1, 216. The output of comparator 2, 216 will flip to zero with an output voltage droop of 0.2 V, and the error and control logic 218 sends another warning notification to the service processor 220 representing the threshold voltage offset of 0.2 V detected by the output flip of the second comparator 2, 216. The output of comparator 3, 216 will flip to zero with a voltage droop of 0.3 V, and the error and control logic 218 sends a yet another warning notification to the service processor 220 representing the threshold voltage offset of 0.3 V. Warning notifications based on detecting respective threshold voltage offsets of 0.1 V, 0.2 V and 0.3 V, which can result from decreasing resistance of the failing output capacitor 206, enables the service processor 220 to monitor progressive degradation of an output power-ground short and schedule a corrective action before a failure occurs. In an embodiment, for example, the on-chip voltage regulator 202 can provide a functional output voltage to enable effective performance of the PLL circuits 204 until the threshold voltage offset exceeds 0.3 V, where the output voltage droops below 0.7 V. The regulator output power-ground short detector 210 can provide a series of warning notifications to the service processor 220 based on the respective threshold voltage offsets, and enable service or replacement of a processor chip including the on-chip voltage regulator 202 before a failure occurs.

In disclosed embodiment, the regulator output power-ground short detector 210 implements features to detect initial output power-ground shorts of the on-chip voltage regulator 202 including initial high resistance output power-ground shorts. In an embodiment, an output power-ground short with a high resistance value can be indistinguishable from normal current load of the voltage regulator output voltage supported by the on-chip voltage regulator 202 during functional operation. In disclosed embodiment, the regulator output power-ground short detector 210 detects an initial or time 0 high resistive output power-ground short, by performing an initial chip test mode. For the initial chip test mode, the on-chip voltage regulator 202 limits an output current supplied to regulate the output voltage. For example in the initial chip test mode, the output current can be limited by two (2) orders of magnitude (e.g., differ by a factor of about 100) lower than the available output current of the voltage regulator 202 supplied to the output VRA rail in the functional mode the on-chip voltage regulator 202. Additionally for the initial chip test mode, a PLL reset mode is enabled for the PLL circuits 204 (e.g., that is similar to the existing PLL reset mode) via a control signal Reset Mode Control applied to the PLL circuits 204 by the error and control logic 218, such that VCOs of the PLL circuits 204 are turned off, which can lower the PLL load current to near zero (0) mA, or in a range between about 0 mA and 30 mA.

Figure 4A:
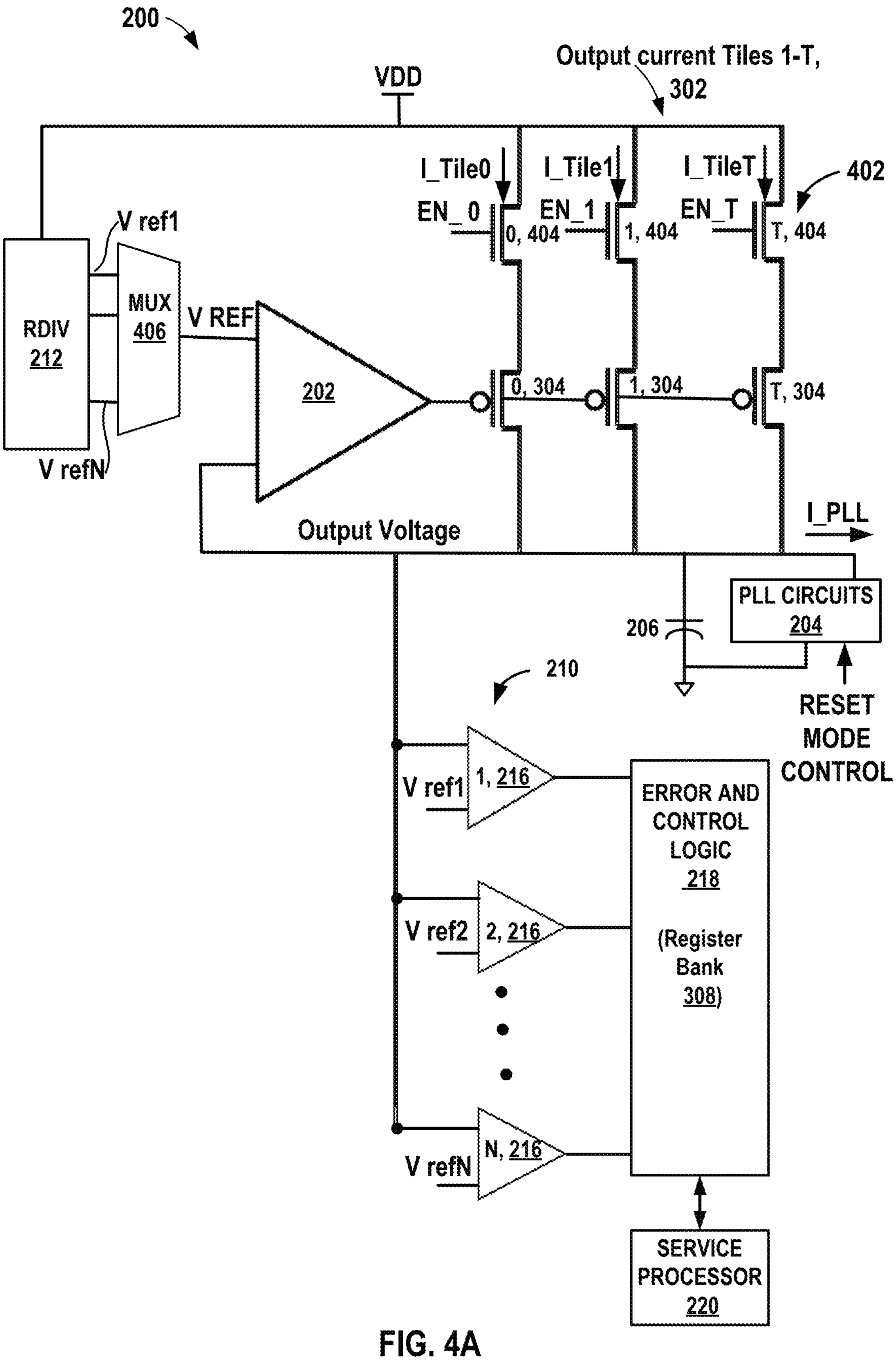
FIGS. 4A and 4B are respective schematic and block diagrams illustrating example output current limiting circuitry of an on-chip voltage regulator of the system of FIG. 2 of disclosed embodiments.
Figure 4B:
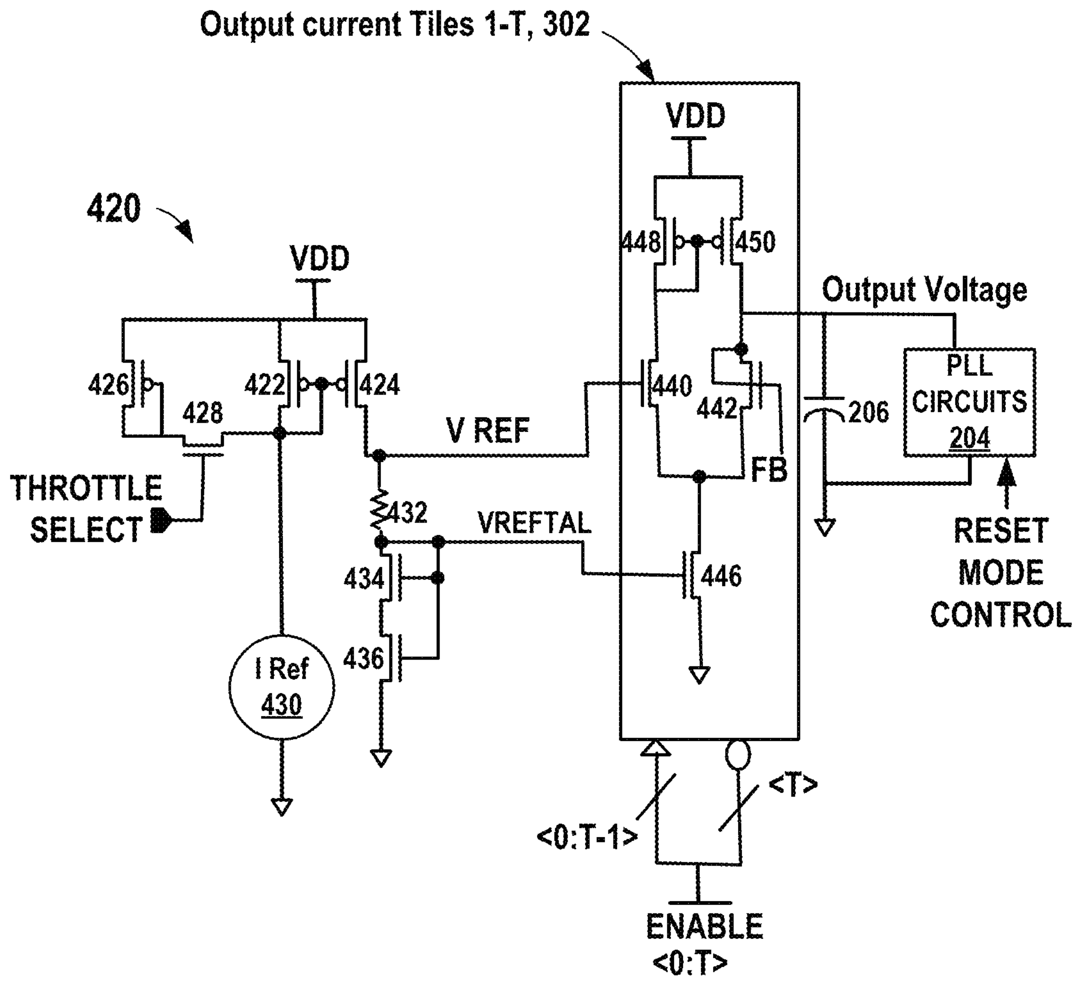
Figure 5:
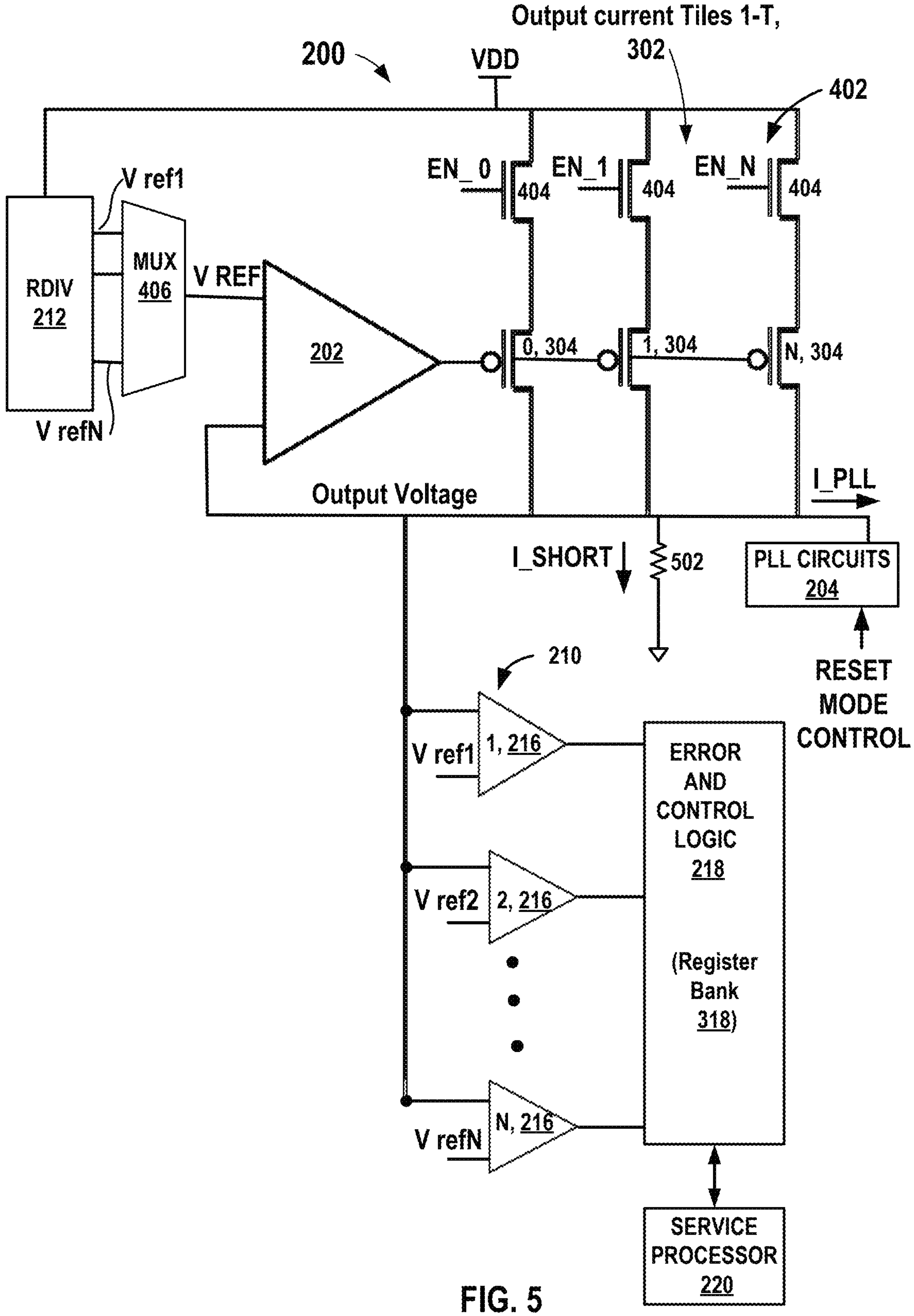
FIG. 5 is a schematic and block diagram illustrating further an example chip test mode of the on-chip voltage regulator of FIG. 2 of disclosed embodiments.

FIG. 4A and FIG. 4B respectively illustrate example alternative current limiting circuitry, of the on-chip voltage regulator 202 used to throttle or limit current in an initial chip test mode of disclosed embodiments. In an embodiment, one of a current limiting circuitry 402 shown in FIG. 4A, or a current limiting circuitry 420 shown in FIGS. 4B and 5, is selectively enabled by the error and control logic 218 for the initial chip test mode for detecting initial output power-ground shorts of the on-chip voltage regulator 202. In an embodiment, a reset mode for the PLL circuits is selectively enabled by the error and control logic 218 for the initial chip test mode, FIG. 4A illustrates example current throttling circuitry 402 provided with each of the plurality of output current tiles 1-T, 302 of a disclosed embodiment. As shown, current limiting circuitry 402 includes a plurality of enable transistors 1-T, 404, with a respective enable transistors 1-T, 404 connected in series with an associated output transistor 1-T, 304 of the associated output current tiles 1-T, 302. As shown, the enable transistors 1-T, 404 has a reference voltage VDD coupled to its drain, and receive a respective enable input EN_0-EN_T at its gate input, with its source connected to its associated output transistor 1-T, 304. During normal functional mode of the on-chip voltage regulator 202, the plurality of enable transistors 1-T, 404 are turned on by the respective enable input EN_0-EN_T so that each of output current tiles 1-T, 302 supplies a respective current, indicated by arrows I_Tile0, I_Tile1, and I_TileN to the output VRA rail.

During the initial chip test mode, the limited output current of the voltage regulator 202 can be supplied by one or two output current tiles 1-T, 302, for example, which are enabled by associated enable transistors 1-T, 404 that are turned on and the other enable transistors 1-T, 404 are disabled or turned off, by the respective enable input EN_0-EN_T. Only the enabled output current tiles 1-T, 302 supply output current for the initial chip test mode. In an embodiment, as shown, system 200 optionally includes a multiplexer 406 coupled to the voltage divider 212 (e.g., resistor divider RDIV 212) to select one of the voltage references V ref1 through V refN that is applied to a reference input of the on-chip voltage regulator 202. In an embodiment, the multiplexer 406 enables using only a single comparator 216 of the comparators 1-N, 216.

In disclosed embodiment, the regulator output power-ground short detector 210 can detect a high resistive output power-ground short with the limited output current for the initial chip test mode, enabled by the current limiting or throttling circuitry 402, using only some of plurality of output current tiles 1-T, 302 to supply output current of the on-chip voltage regulator 202. In an embodiment as shown in FIG. 4A, system 200 optionally includes a register bank 308 of the error and control logic 218 coupled to the comparators 1-T, 216, which receives, from one comparator 216, an output flip to zero with a voltage droop or threshold voltage offset of the output voltage below the reference voltage V REF, and the error logic 218 transmits a warning notification to the service processor 220 indicating the output power-ground short detected in the initial chip test mode.

FIG. 4B illustrates example output current limiting circuitry 420 optionally used to limit output current of the on-chip voltage regulator 202 to enable detecting initial output power-ground shorts of the on-chip voltage regulator 202 during the initial chip test mode of disclosed embodiments. In an embodiment, the output current limiting circuitry 420 controls a reference current for the output current tiles 1-T, 302 so that the output current tiles 1-T, 302 are enabled and supply a lower current for the initial chip test mode. In an embodiment, the output current tiles 1-T, 302 may supply a maximum current for the initial chip test mode that is significantly lower than a load current supplied by the output current tiles 1-T, 302 during a normal functional mode. For example, the respective output current tiles 1-T, 302 may supply a maximum current of 2 mA for the initial chip test mode, where the respective output current tiles 1-T, 302 supply load current of 20 mA or higher during a normal functional mode.

In an embodiment, the output current limiting circuitry 420 receives a throttle select signal to control a reference current supplied to the output current tiles 1-T, 302 to limit the output current supplied during the initial chip test mode. As shown, current limiting circuitry 420 includes a plurality of PFETs 422, 424, 426, each having a source connected to a reference voltage VDD. The current limiting circuitry 420 includes an NFET 428 receiving the control throttle select at its gate, PFET 422 forms a catch diode by having its gate connected to its drain and may be referred to as a catch diode PFET 422. In other words, a catch diode may be formed from a PFET by connecting the gate and drain of the PFET together. In normal operation, the NFET 428 is turned off, a current source 430 (I Ref) is connected to the drain of PFET 422, and the gate of each of the PFETs 422 and 424. In normal operation, the current in PFET 422 is mirrored in PFET 424, which provides a first reference current coupled to the output current tiles 1-T, 302, enabling a normal current of the output current tiles 1-T, 302 applied to the output VRA.

The PFET 426 functions as a current limiting transistor, which is selectively coupled to the catch diode PFET 422 by the throttle select switch NFET 428, to lower the reference current provided by the PFET 424 (e.g., reference transistor) for the initial chip test mode. When NFET 428 is activated for the initial chip test mode, NFET 428 couples the drain of PFET 426 to the current source 430, the drain of PFET 422, and the gate of each of the PFETs 422 and 424. The drain of PFET 424 at node V REF is coupled by a resistor 432 to a pair of series-connected NFETS 434 and 436. At node VREFTAL, a drain of NFET 434 and a gate of each of the series-connected NFETS 434 and 436 is connected to the resistor 432, and a source of NFET 436 is connected to ground. As shown, the output current limiting circuitry 420 is coupled to each of the current tiles 1-T, 302 at the respective nodes V REF and VREFTAL An illustrated, each of the example current tiles 302 includes a pair of NFETs 440 and 442, each having a source connected to a drain of an NFET 446, a gate of NFET 440 is connected to the output current limiting circuitry 420 at node V REF and a gate of NFET 442 connected to a node FG. A gate of NFET 446 is connected to the output current limiting circuitry 420 at node VREFTAL and its source is connect to ground. The current tile 302 includes a pair of PFETs 448 and 450, each having a source connected to the reference voltage VDD, and a gate connected to the drain of NFET 440. The drain of PFET 448 is connected to a source of NFET 440 and the drain of PFET 450 is connected to a source of NFET 442.

In an embodiment during the initial chip test mode, the output current limiting circuitry 420 provides a second reference current (e.g., the second reference current is two orders of magnitude lower than the first reference current for the functional mode) coupled to the output current tiles 1-T, 302 to limit output current of the output current tiles 1-T, 302 of the on-chip voltage regulator 202. The PFET 426 has a selected large size, (e.g. large number of fins) relative to the PFETs 422 and 424, to provide a second reference current coupled to the output current tiles 1-T, 302 to limit output current of the output current tiles 1-T, 302 during the initial chip test mode.

FIG. 5 further illustrates an example chip test mode of the on-chip voltage regulator 202 of disclosed embodiments for detecting initial output power-ground shorts of the on-chip voltage regulator 202 including initial high resistance output power-ground shorts. During the initial chip test mode, the output current tiles 1-T, 302 supply limited output current of the on-chip voltage regulator 202, which is selectively limited by the current throttling circuitry 402 of FIG. 4A, or the current limiting circuitry 420 of FIG. 4B. Optionally, a reset mode control is applied to the PLL circuits 204 so that the load current indicated by arrow I_PLL is substantially lower for the chip test mode. A load current indicated by arrow I_SHORT drawn by a resistor 502 represents a resistance value of an output power-ground short of the output VRA capacitor 206.

In an embodiment, the regulator output power-ground short detector 210 can detect an initial output power-ground short of the output VRA capacitor 206 that has a high resistance value of the illustrated resistor 502 in the chip test mode. For example, a small current I_SHORT drawn by an initial output power-ground short with a high resistance of resistor 502, such as a 100 Ohm short, would not be detected in a normal functional test mode. During the chip test mode with the limited maximum current, the on-chip voltage regulator 202 cannot support the small current I_SHORT drawn by resistor 502, and would be detected by the regulator output power-ground short detector 210. In an embodiment, the current I_SHORT through the high resistance short or resistor 502 causes a decreased voltage of the output voltage, which is less than the reference voltage V REF applied by the multiplexer 406 to the first input of the on-chip voltage regulator 202. In an embodiment, a large current I_SHORT through a low resistance short, such as a 3 Ohm resistor 502, could be detected by the regulator output power-ground short detector 210 in both the normal functional test mode and the chip test mode.

Figure 6:
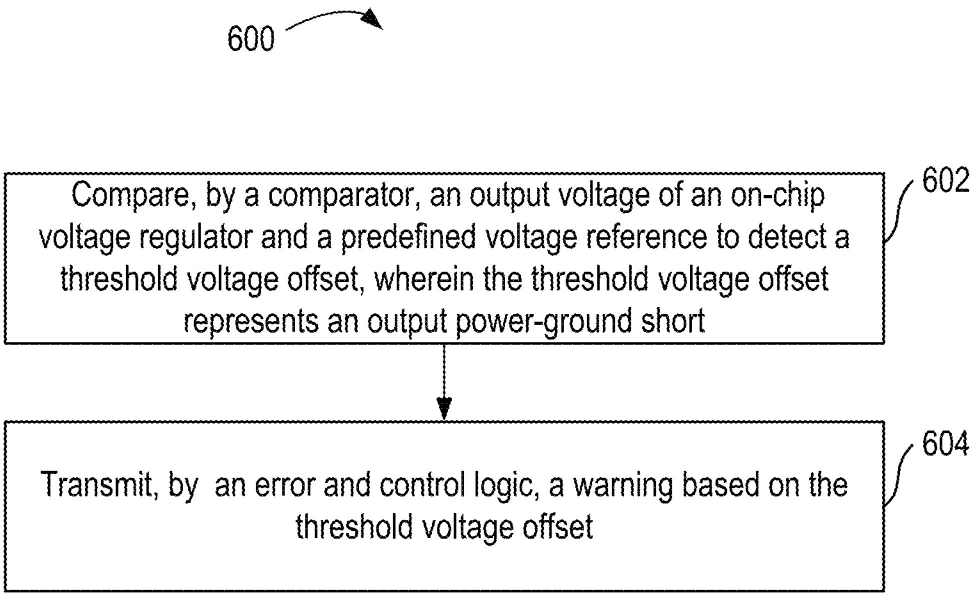
FIG. 6 is a flowchart illustrating example features and operations of a method for detecting output power-ground shorts in an on-chip voltage regulators of a disclosed embodiment.

FIG. 6 is a flowchart illustrating example features and operations of a method 600 for detecting output power-ground shorts in on-chip voltage regulators of a disclosed embodiment. Method 600 can be implemented by system 200 in conjunction with the computer 101 and cloud environment of the computing environment 100 of FIG. 1 with the Regulator Power-Ground Short Detector Control Code 182 of disclosed embodiments.

At block 602, a comparator compares an output voltage of an on-chip voltage regulator and a predefined voltage reference to detect a threshold voltage offset, wherein the threshold voltage offset represents an output power-ground short. In an embodiment, the on-chip voltage regulator 202 provides the output voltage to the PLL circuits 204 at an intended voltage, such as 1.0 V, and the PLL circuits 204 is simulated and characterized for effective operation, for example, above a minimum voltage of 0.7 V. In an embodiment, when an output VRA capacitor 206 fails its initial high resistance decreases as an output power-ground short degrades over time, the voltage regulator output voltage decreases over time and the PLL circuits 204 fail if the voltage regulator output voltage goes below the minimum voltage. In disclosed embodiments, the regulator output power-ground short detector 210 detects initial output power-ground shorts of the on-chip voltage regulator 202 including initial high resistance output power-ground shorts in the chip test mode, and detects output power-ground shorts that occur in a user's environment, for example, resulting from a degrading or failing output VRA capacitor 206 in the functional test mode of system 200.

In an embodiment, a series of comparators 1-N, 216 compares the output voltage with a plurality of predefined voltage references, to detect a respective threshold voltage offset by the series of comparators. In an embodiment, a voltage divider 212 divides the reference voltage Reference input to the on-chip voltage regulator 202 to provide a plurality of voltage references V ref1 through V refN at respective taps between series-connected resistors 1-N, 214.

At block 604, an error and control logic transmits a warning notification based on the threshold voltage offset. In an embodiment, the error and control logic transmits a series of warning notifications, based on the respective threshold voltage offsets for a plurality of voltage references V ref1 through V refN. In an embodiment, the regulator output power-ground short detector detects predefined threshold voltage offsets of a degraded power-ground short over time, and transmits warning notifications that enable corrective actions, such as repair or replacement of a processor chip before failure of the on-chip voltage regulator.

While the foregoing is directed to embodiments of the present invention, other and further embodiments of the invention may be devised without departing from the basic scope thereof, and the scope thereof is determined by the claims that follow.

What is claimed is:

1. A method comprising:

comparing, by comparator circuitry, an output voltage of an on-chip voltage regulator with a plurality of predefined voltage references;

detecting successive threshold voltage offsets by the comparator circuitry corresponding to progressive degradation of an output power-ground short, wherein the threshold voltage offsets represent the output power-ground short; and transmitting, by error and control logic, one or more warning notifications based on the successive threshold voltage offsets before the output voltage decreases below a minimum operating voltage.

2. The method of claim 1, wherein:

the comparator circuitry comprises a series of comparators.

3. The method of claim 1, further comprising transmitting, by the error and control logic, a plurality of warning notifications based on the progressive degradation of the output power-ground short.

4. The method of claim 2, further comprising producing, by a voltage divider, the plurality of predefined voltage references, wherein the voltage divider comprises a plurality of series-connected resistors coupled between a voltage reference input to the on-chip voltage regulator and a ground potential, and the plurality of predefined voltage references are produced at respective taps between the series-connected resistors.

5. The method of claim 1, further comprising for an initial chip test mode, limiting, by a current limiting circuitry of the on-chip voltage regulator, an output current of the on-chip voltage regulator; and comparing, by the comparator circuitry, the output voltage and the plurality of predefined reference voltages, to detect the output power-ground short.

6. The method of claim 5, wherein the on-chip voltage regulator comprises a plurality of output current tiles supplying the output current, further comprising the current limiting circuitry selectively enabling at least one of the plurality of output current tiles, and disabling other ones of the plurality of output current tiles, to limit the output current of the on-chip voltage regulator for the initial chip test mode.

7. The method of claim 6, wherein the current limiting circuitry comprises a plurality of enable transistors, with a respective enable transistor connected in series with an associated output current tile, and the enable transistors receiving a gate control signal to turn on the enable transistors for selectively enabling at least one of the plurality of output current tiles.

8. The method of claim 5, wherein the on-chip voltage regulator comprises a plurality of output current tiles supplying the output current, and the current limiting circuitry selectively provides a reference current to the plurality of output current tiles to limit the output current of the on-chip voltage regulator for the initial chip test mode.

9. The method of claim 8, wherein the current limiting circuitry comprises a current source coupled to a catch diode, a reference transistor coupled to the catch diode to provide the reference current to the plurality of output current tiles based on the current source, and a current limiting transistor selectively coupled to the catch diode by a throttle select switch to limit the reference current provided to the plurality of output current tiles for the initial chip test mode.

10. The method of claim 5, further comprising applying, by the error and control logic, a control input to phase-locked-loop (PLL) circuits receiving the output voltage of the on-chip voltage regulator to provide a reset mode for the PLL circuits to limit a current load of the PLL circuits for the initial chip test mode.

11. A system, comprising:

an on-chip voltage regulator configured to receive a reference voltage and provide an output voltage;

comparator circuitry configured to compare the output voltage of the on-chip voltage regulator with a plurality of predefined voltage references to detect successive threshold voltage offsets, wherein the successive threshold voltage offsets correspond to degradation of an output power-ground short, wherein the threshold voltage offsets represent the output power-ground short; and an error and control logic configured to transmit one or more warning notifications based on the successive threshold voltage offsets before the output voltage decreases below a minimum operating voltage.

12. The system of claim 11, wherein:

the comparator circuitry comprises a series of comparators configured to compare the output voltage with the plurality of predefined voltage references, and detect the successive threshold voltage offsets by the series of comparators, to monitor the degradation of the output power-ground short; and wherein the error and control logic is configured to transmit a series of warning notifications, based on the degradation of the output power-ground short.

13. The system of claim 12, further comprising:

a voltage divider configured to produce the plurality of predefined voltage references, wherein the voltage divider comprises a plurality of series-connected resistors coupled between a voltage reference input to the on-chip voltage regulator and a ground potential; and wherein the plurality of predefined voltage references are produced at taps between the series-connected resistors.

14. The system of claim 13, further comprising a multiplexer coupled to the voltage divider, wherein the multiplexer is configured to receive the plurality of predefined voltage references and select one of the plurality of predefined voltage references to compare to the output voltage for an initial chip test mode.

15. The system of claim 11, wherein the on-chip voltage regulator comprises a plurality of output current tiles supplying an output current of the on-chip voltage regulator, and current limiting circuitry configured to limit the output current of the on-chip voltage regulator for an initial chip test mode.

16. The system of claim 15, wherein the current limiting circuitry comprises a plurality of enable transistors, wherein the enable transistors are connected in series with associated output current tiles, and the enable transistors are configured to receive a control gate input to selectively enable an associated output current tile to supply output current for the initial chip test mode.

17. The system of claim 15, wherein the current limiting circuitry is configured to apply a reference current to the plurality of output current tiles to limit the output current supplied by the plurality of output current tiles for the initial chip test mode.

18. The system of claim 17, wherein the current limiting circuitry comprises a current source coupled to a catch diode, a reference transistor coupled to the catch diode to provide the reference current to the plurality of output current tiles based on the current source; and a current limiting transistor selectively coupled to the catch diode by a throttle select switch, to limit the reference current provided by the reference transistor for the initial chip test mode.

19. The system of claim 18, wherein the catch diode, the reference transistor, and the current limiting transistor comprise metal-oxide semiconductor (MOS) p-type field effect transistors (PFETs), the catch diode is a catch diode PFET, and the reference transistor is a reference PFET, and wherein a reference voltage is coupled to a source of the PFETs, and a gate and a drain of the catch diode PFET are coupled together to the current source and coupled to a gate of the reference PFET.

20. An integrated circuit, comprising:

an on-chip voltage regulator configured to receive a reference voltage and provide an output voltage;

a comparator configured to compare the output voltage of the on-chip voltage regulator with a predefined reference voltage to detect a threshold voltage offset representing an output power-ground short, and further configured to detect successive threshold voltage offsets corresponding to degradation of the output power-ground short; and an error and control logic configured to transmit one or more warning notifications based on the successive threshold voltage offsets before the output voltage decreases below a minimum operating voltage.

* * * * *